US006875703B1

(12) United States Patent
Furukawa et al.

(10) Patent No.: US 6,875,703 B1
(45) Date of Patent: Apr. 5, 2005

(54) METHOD FOR FORMING QUADRUPLE DENSITY SIDEWALL IMAGE TRANSFER (SIT) STRUCTURES

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/760,500

(22) Filed: Jan. 20, 2004

(51) Int. Cl.$^7$ ............................................. H01L 21/461
(52) U.S. Cl. ...................... 438/736; 438/717; 438/694
(58) Field of Search .................................. 438/713, 717, 438/736, 737, 694, 696

(56) References Cited

U.S. PATENT DOCUMENTS 6,063,688 A * 5/2000 Doyle et al. ................ 438/424
6,413,812 B1 * 7/2002 Harshfield ................ 438/237

\* cited by examiner

*Primary Examiner*—Caridad Everhart
(74) *Attorney, Agent, or Firm*—Joan Pennington (57) ABSTRACT

A method is provided for forming a quadruple density sidewall image transfer (SIT) structure. Oxide spacers are formed on opposite sidewalls of a first mandrel. The oxide spacers form a second mandrel. Then sidewall spacers are formed on opposite sidewalls of the oxide spacers forming the second mandrel. A pattern of the sidewall spacers is used to form the quadruple density sidewall image transfer (SIT) structure. The method of the invention enables formation of four well-controlled lines for each lithographically minimum pitch dimension.

9 Claims, 10 Drawing Sheets

FIG. 9 ent invention relates generally to the field of
METHOD FOR FORMING QUADRUPLE DENSITY SIDEWALL IMAGE TRANSFER (SIT) STRUCTURES

FIELD OF THE INVENTION

The present invention relates generally to the field of semiconductor manufacturing and, more specifically, to a method for forming a quadruple density sidewall image transfer (SIT) structure.

DESCRIPTION OF THE RELATED ART

Improvements in photolithography are driving continued shrinkage of dimensions in advanced semiconductor manufacturing. Photolithography is, however, finding progress increasingly expensive and difficult. Cost of advanced photo tooling continues to significantly increase and costs of consumables, such as resist, are also skyrocketing.

Meeting line width objectives has also required introduction of many new ways of enhancing traditional processes such as mask making and data preparation. These techniques introduce errors and, of course, additional expense.

It is highly desirable to provide a method which can meet or exceed line width control objectives for future technologies without requiring the use of new and more expensive tooling.

SUMMARY OF THE INVENTION

A principal object of the present invention is to provide a method for forming a quadruple density sidewall image transfer (SIT) structure. Other important objects of the present invention are to provide such method for forming a quadruple density sidewall image transfer (SIT) structure substantially without negative effect and that overcome many of the disadvantages of prior art arrangements.

In brief, a method is provided for forming a quadruple density sidewall image transfer (SIT) structure. Oxide spacers are formed on opposite sidewalls of a first mandrel. The oxide spacers form a second mandrel. Then sidewall spacers are formed on opposite sidewalls of the oxide spacers forming the second mandrel. A pattern of the sidewall spacers is used to form the quadruple density sidewall image transfer (SIT) structure.

In accordance with features of the invention, the method of the invention enables formation of four well-controlled lines for each lithographically minimum pitch dimension. The method of the invention employs spacers-on-spacers, with one spacer formed utilizing oxidation to better balance line space sizes.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Sidewall Image Transfer (SIT) techniques form conductors with very narrow widths or semiconductor devices with very short gate lengths without using critical photolithography. Sidewall Image Transfer has been proposed as a way to produce well-controlled images having sub-lithographic dimensions.

Use of sidewall spacers to define feature dimensions offers an opportunity to build two shapes using each starting shape since each starting shape, for example, printed using standard lithography, has two edges. Resulting features thus can have half the pitch possible using the same lithographic tools in a conventional printing process. It is desirable to extend the frequency doubling opportunity to even smaller dimensions.

In accordance with features of the preferred embodiment, an extension of the sidewall image transfer (SIT) approach is provided to enable formation of four well-controlled lines for each lithographically minimum pitch dimension. The method of the preferred embodiment is to employ spacers-on-spacers, with one spacer formed utilizing oxidation to better balance line space sizes.

Figure 1:
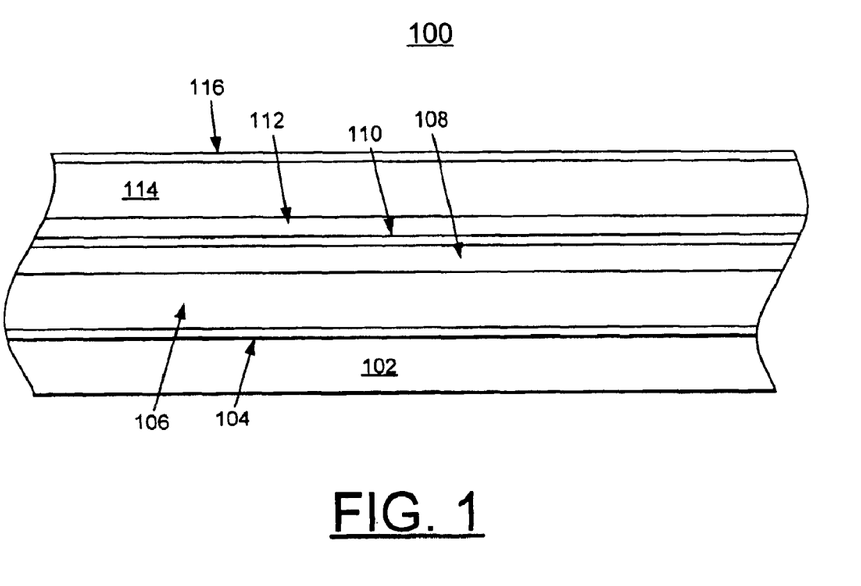
FIG. 1 is a side view of an exemplary starting structure for forming a quadruple density sidewall image transfer (SIT) structure in accordance with a method of the preferred embodiment.

Referring now to the drawings, in FIG. 1 there is shown an exemplary starting structure generally designated by the reference character 100 for forming a quadruple density sidewall image transfer (SIT) structure in accordance with the preferred embodiment. The exemplary starting structure 100 includes a substrate 102, such as a silicon substrate 102, a gate dielectric layer 104 and a gate conductor 106, such as polysilicon or gate conductor poly 106. Formed over the gate conductor poly layer 106 of the exemplary starting structure 100 includes an oxide hardmask layer 108, a poly etch stop layer 110, a first nitride layer 112, and a poly mandrel layer 114, such as polysilicon mandrel layer 114 capped with a second, thinner nitride layer 116. It should be understood that other materials than polysilicon that are partially consumed in formation of the edge material could be used for the poly mandrel layer 114.

Figure 2A:
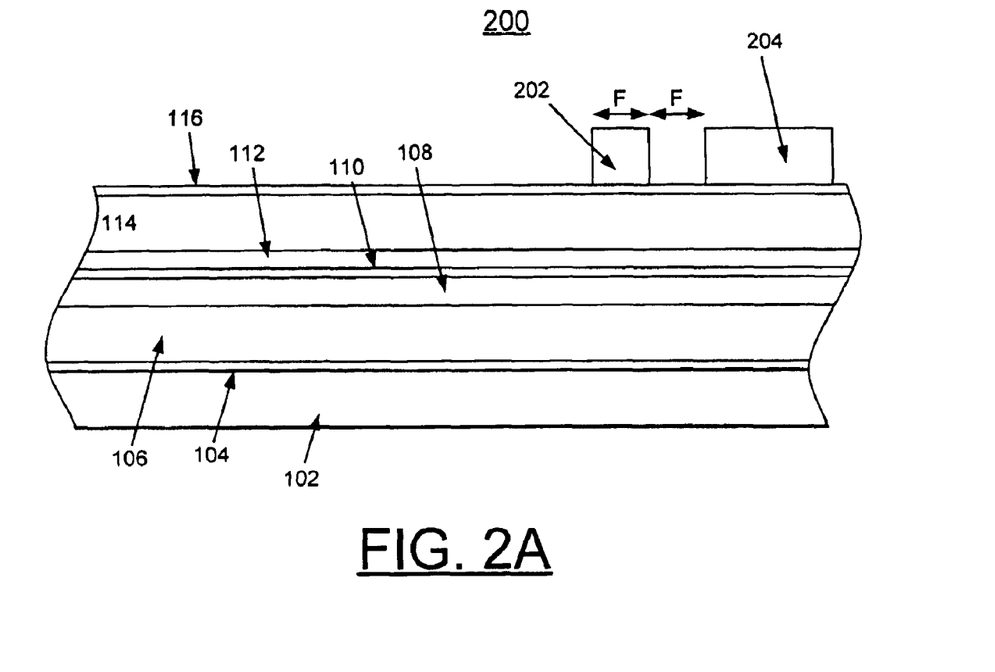
FIGS. 2A, 2B, and 3–9 are side views not to scale illustrating exemplary steps of a method for forming a quadruple density sidewall image transfer (SIT) structure starting with the exemplary starting structure of FIG. 1 in accordance with the preferred embodiment.
Figure 2B:
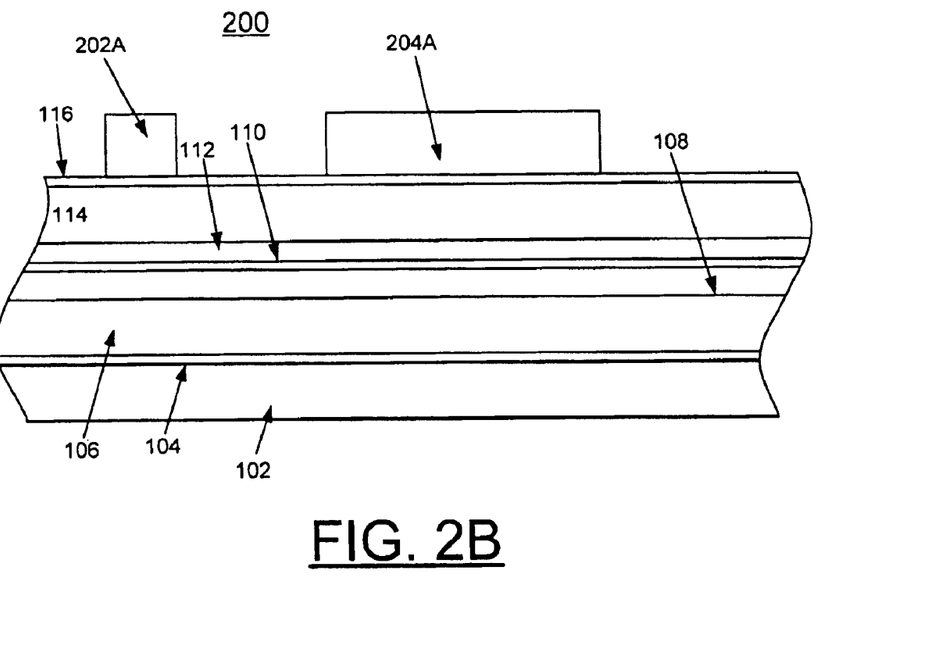

FIGS. 2A and 2B illustrates a print mandrel mask step generally designated by the reference character 200 with a respective pair of photoresist features 202, 204; and 202A, 204A formed on top of the exemplary starting structure 100 in accordance with the preferred embodiment. In FIG. 2A, the photoresist feature 202 has a width indicated by an arrow labeled F and is spaced apart from the photoresist feature 204 by a distance indicated by an arrow labeled F, for example, representing a lithographically minimum pitch dimension. In FIG. 2B, the photoresist features 202A, 204A are illustrated corresponding to a next processing step of FIG. 3.

Figure 3:
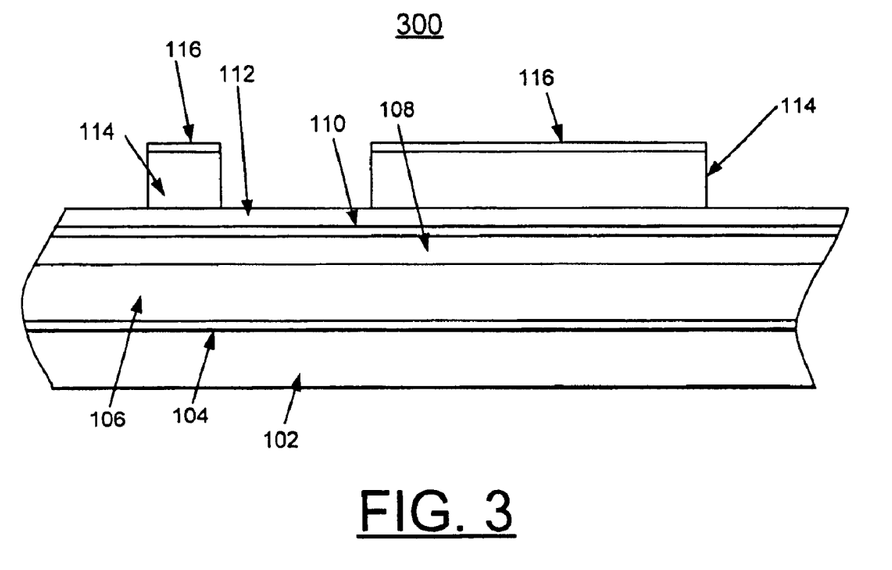

FIG. 3 illustrates a next step of the method generally designated by the reference character 300 where the nitride layer 116 and the poly mandrel features 114 are etched corresponding to the photoresist features 202A, 204A and the photoresist features 202A, 204A are stripped.

Figure 4:
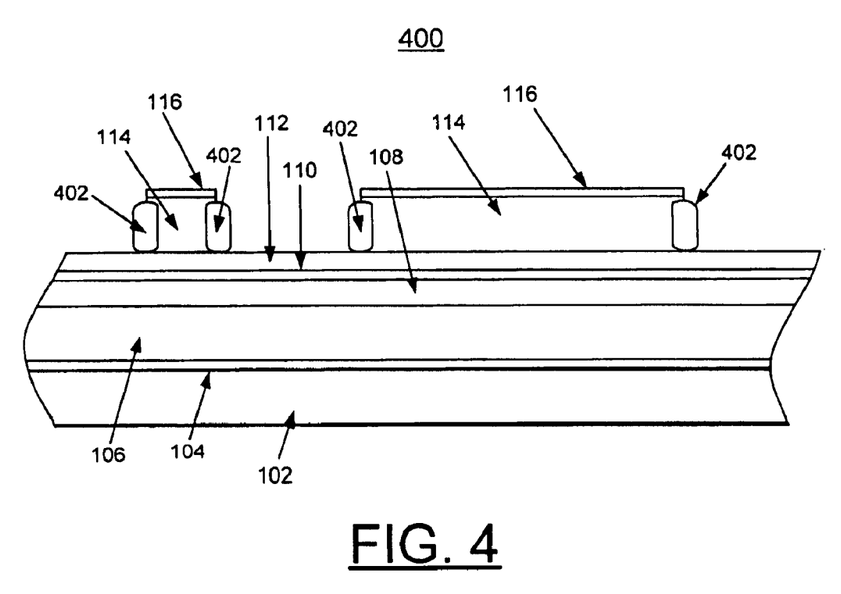

Referring now to FIG. 4, in a next step of the method generally designated by the reference character 400 an oxide 402 is grown on each sidewall of the etched first mandrels 114. These oxides 402 defining oxide spacers form a second mandrel 402. The nitride films 112, 116 protect the second poly etch stop layer 110 and the top of the first mandrel 114 from oxidation.

Figure 5:
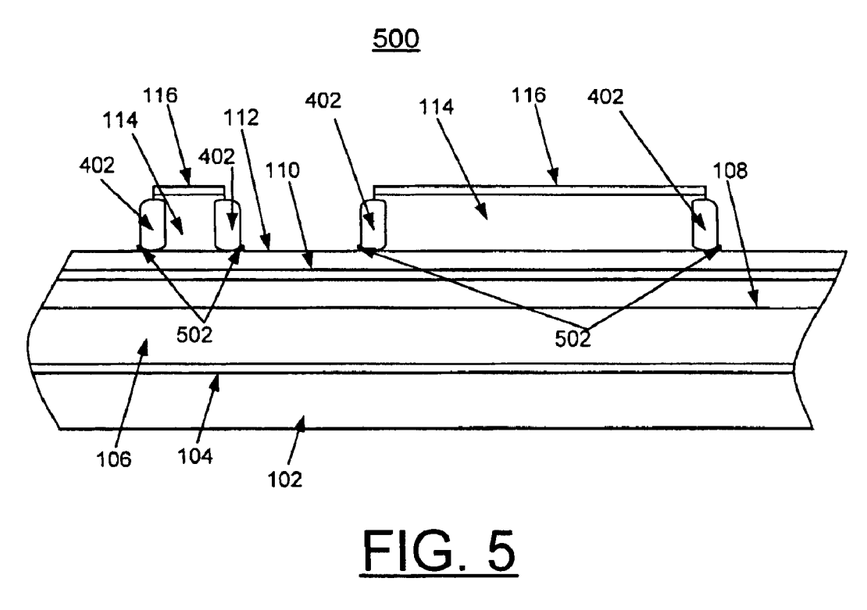

FIG. 5 illustrates a next optional step of the method generally designated by the reference character 500. The grown oxide spacer mandrel 402 may not have an ideal profile where it meets the underlying nitride layer 112, and the grown oxide spacer mandrel 402 may not adhere properly to the underlying nitride 112. To alleviate this difficulty, while the grown oxide spacer mandrel 402 is still attached to the first poly mandrel 114, a thin oxide generally designated by the reference character 502, such as a thin Chemical Vapor Deposition (CVD) oxide 502 optionally is deposited and etched, if required, to fill any possible undercut profile of the thermally grown oxide spacer second mandrel 402.

Figure 6:
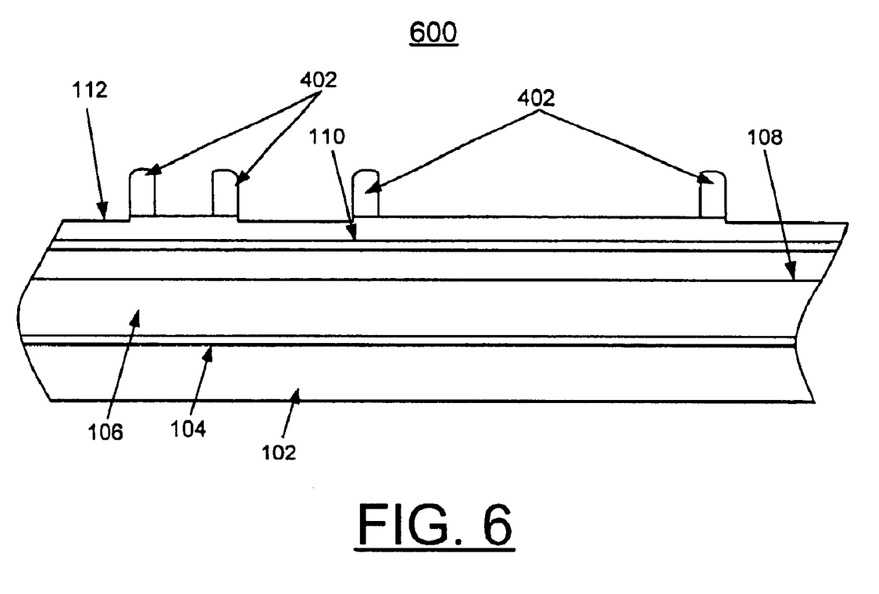

Referring now to FIG. 6, in a next step of the method generally designated by the reference character 600, directional etching, such as RIE, is performed to remove the nitride film 116. The directional etching is stopped before breaking through the nitride film 112 and then the poly first mandrel 114 is removed. Poly removal can be done either all wet or dry poly removal with an isotropic component to guarantee full removal of the polysilicon mandrel 114.

Figure 7:
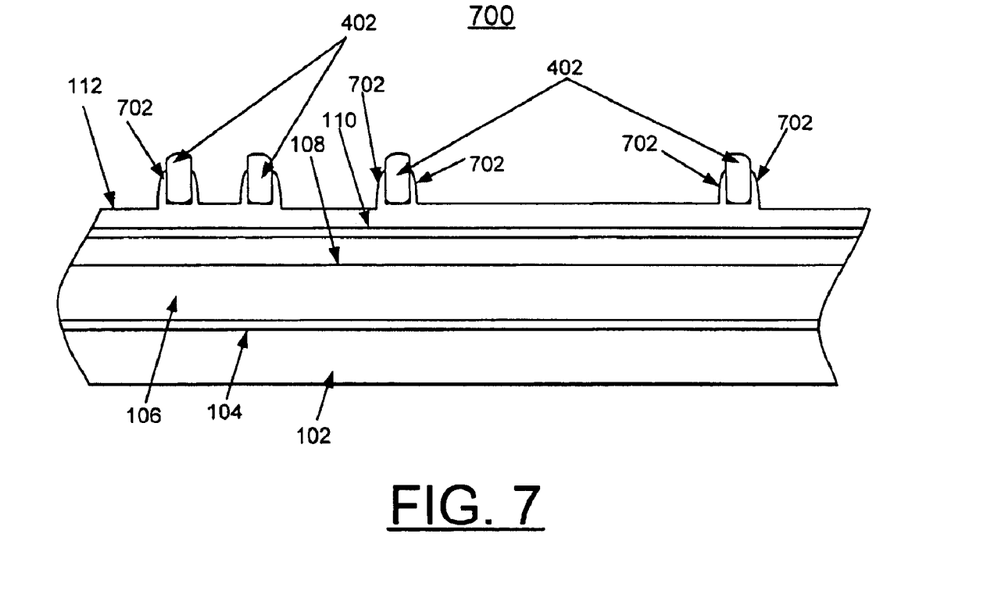

FIG. 7 illustrates a sidewall spacer forming step 700 employing spacers-on-spacers in accordance with the preferred embodiment. A plurality of sidewall spacers 702 are formed using any suitable technique, such as by conformal deposition and directional etch of a nitride layer. Each sidewall spacer 702 is relatively thin. The sidewall spacers 702 are formed on sidewalls of each thermally grown oxide spacer second mandrel 402.

Figure 8:
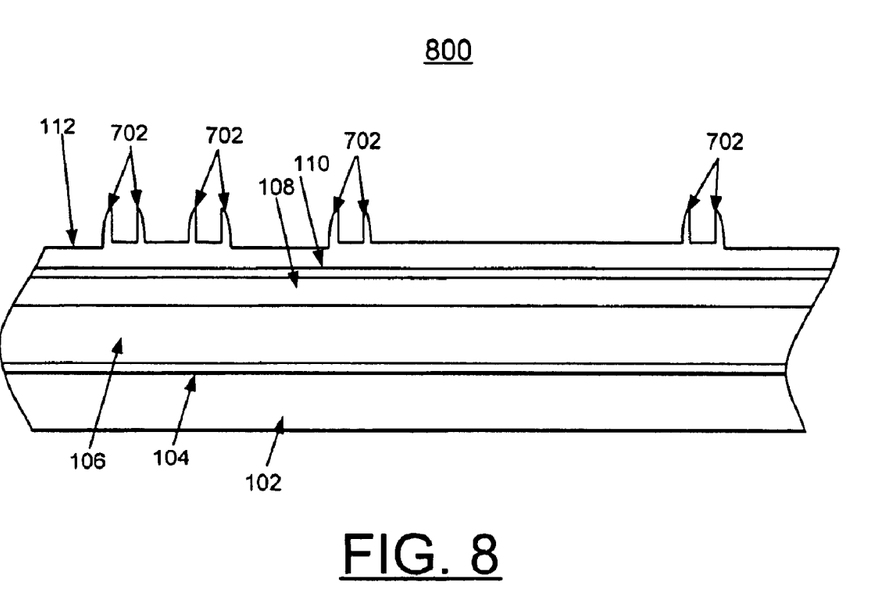

Referring now to FIG. 8, in a next step of the method generally designated by the reference character 800, the thermally grown oxide spacer second mandrel 402 is removed. The remainder of the nitride oxidation/etch-stop layers 112, 110, 108 then is removed by Reactive Ion Etching (RIE), while maintaining the profile and width of the nitride spacers 702.

Figure 9:
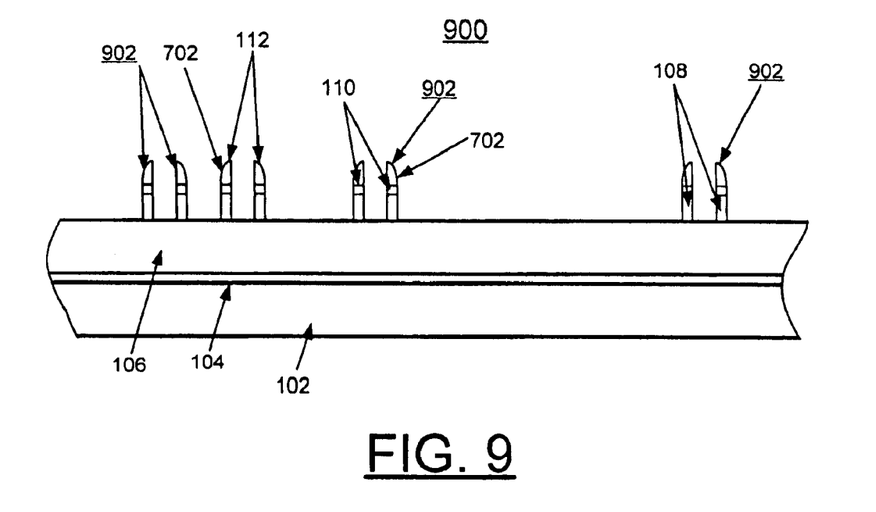

Referring now to FIG. 9, in a final step of the method generally designated by the reference character 900, a pattern 902 of the nitride spacers 702 is transferred into the poly etch stop layer 110 and the oxide hardmask layer 108, and the nitride layer 112 is stripped. Produced now is the desired quadruple density (oxide) hardmask for gate conductor etch.

As is obvious to a person skilled in the art, the described method forms loops of only one dimension. Conventional SIT processing includes two additional masks of which the first mask trims the loops and the second mask adds larger shapes of any desired dimension. It should be understood that these conventional two additional masks apply to the method of the preferred embodiment also.

While the present invention has been described with reference to the details of the embodiments of the invention shown in the drawing, these details are not intended to limit the scope of the invention as claimed in the appended claims.

What is claimed is:

1. A method for forming a quadruple density sidewall image transfer (SIT) structure comprising the steps of:

forming oxide spacers on opposite sidewalls of a first mandrel including the steps of providing a starting structure including multiple layers; said multiple layers of said starting structure including a substrate, a gate dielectric layer, a gate conductor; an oxide hardmask layer, a poly etch stop layer, a first nitride layer, and a poly mandrel layer capped with a second, thinner nitride layer; said oxide spacers forming a second mandrel;

forming sidewall spacers on opposite sidewalls of said oxide spacer second mandrel; and using a pattern of said sidewall spacers to form the quadruple density sidewall image transfer (SIT) structure.

2. A method as recited in claim 1 wherein the step of forming oxide spacers on opposite sidewalls of said first mandrel further includes the steps of providing a print mandrel mask on said starting structure; using said print mandrel mask and etching said second, thinner nitride layer and said poly mandrel layer to define said first mandrel; and removing said print mandrel mask.

3. A method as recited in claim 2 wherein the step of forming said oxide spacers on opposite sidewalls of said first mandrel further includes the steps of thermally growing oxide hardmask spacers on opposite sidewalls of said first mandrel.

4. A method as recited in claim 3 further includes the step of filling any undercut profile of said thermally grown oxide hardmask spacers on opposite sidewalls of said first mandrel using a thin Chemical Vapor Deposition (CVD) oxide.

5. A method as recited in claim 3 further includes the step of removing said first mandrel.

6. A method as recited in claim 2 wherein the step of forming sidewall spacers on opposite sidewalls of said oxide spacer second mandrel includes the steps of forming nitride hardmask spacers on opposite sidewalls of said oxide spacer second mandrel.

7. A method as recited in claim 6 includes the steps of forming said nitride hardmask spacers by conformal deposition and directional etch of a nitride layer on opposite sidewalls of said oxide spacer second mandrel.

8. A method as recited in claim 6 includes the steps of removing said oxide spacer second mandrel; and removing said first nitride layer, said poly etch stop layer, and said oxide hardmask layer by Reactive Ion Etching (RIE), while maintaining a profile and a width of said nitride hardmask spacers.

9. A method as recited in claim 6 wherein the step of using said pattern of said sidewall spacers to form the quadruple density sidewall image transfer (SIT) structure includes the steps of transferring said pattern of said nitride hardmask spacers into said poly etch stop layer, and said oxide hardmask layer to form the quadruple density sidewall image transfer (SIT) structure.

\* \* \* \* \*